(12) United States Patent
Guiragossian et al.

(10) Patent No.: US 6,924,559 B2
(45) Date of Patent: Aug. 2, 2005

(54) ELECTRONIC DEVICE WITH HEAT CONDUCTIVE ENCASING DEVICE

(75) Inventors: Nicolas Guiragossian, Merignag (FR); Catherine Dupin, Talence (FR); Christophe Venencie, Le Pian Medoc (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/432,034

(22) PCT Filed: Jul. 6, 2001

(86) PCT No.: PCT/FR01/02187

§ 371 (c)(1),
(2), (4) Date: May 19, 2003

(87) PCT Pub. No.: WO02/05346

PCT Pub. Date: Jan. 17, 2002

(65) Prior Publication Data

US 2004/0026798 A1 Feb. 12, 2004

(30) Foreign Application Priority Data

Jul. 7, 2000 (FR) ............................................ 00 08916

(51) Int. Cl.⁷ .......................... H01L 23/02; H01L 23/28; H01L 23/34
(52) U.S. Cl. ....................... 257/796; 257/720; 257/717; 257/713; 257/678; 257/788
(58) Field of Search .............................. 257/713, 717, 257/720, 796, 788, 678, 712

(56) References Cited

U.S. PATENT DOCUMENTS

| | | | | |
|---|---|---|---|---|
| 5,883,430 A | * | 3/1999 | Johnson ....................... | 257/706 |
| 6,104,093 A | * | 8/2000 | Caletka et al. ............... | 257/778 |
| 6,623,999 B1 | * | 9/2003 | Nishikawa ................... | 438/29 |

FOREIGN PATENT DOCUMENTS

| | | | |
|---|---|---|---|
| DE | 19704549 A1 | 8/1997 | |
| EP | 0000856 A1 | 2/1979 | |
| EP | 0883175 A2 | 12/1998 | |
| EP | 0902611 A2 | 3/1999 | |
| JP | 63107147 A | 5/1988 | |
| JP | 2268458 A | 11/1990 | |
| JP | 4076944 A | 3/1992 | |
| JP | 5109942 A | 4/1993 | |
| JP | 05109942 | * 4/1993 | .................... 23/36 |
| JP | 340382 A | 12/1999 | |

* cited by examiner

*Primary Examiner*—Nathan J. Flynn
*Assistant Examiner*—Victor A. Mandala, Jr.
(74) *Attorney, Agent, or Firm*—Lowe Hauptman & Berner, LLP

(57) ABSTRACT

The invention relates to the field of electronic devices with a thermally conducting encapsulant for draining away some of the energy dissipated by the electronic components contained in the electronic device. This is an electronic device comprising: a circuit (7) on which several electronic components (8) able to dissipate energy are placed; a thermal conducting cover (1) located opposite the circuit (7); a thermally conducting encapsulant (4) placed between the circuit (7) and the cover (1) so as to ensure heat transfer, by conduction toward the cover (1), of the energy dissipated in the components (8); the respective surfaces of the encapsulant (4) and of the cover (1) which are facing each other including a number of substantially complementary recesses (3, 6) and projections (2, 5) allowing the cover (1) to fit into the encapsulant (4), and gaps (j1, j2) being left between the recesses (3, 6) and the projections (2, 5) so as, on the one hand, to reduce the stress exerted by the cover (1) on the encapsulant (4) in the direction of the circuit (7) and on the other hand, to maintain the thermal conduction between the encapsulant (4) and the cover (1) above a given conduction threshold.

The invention can be applied in particular to digital electronic cards.

20 Claims, 3 Drawing Sheets

ELECTRONIC DEVICE WITH HEAT CONDUCTIVE ENCASING DEVICE

The invention relates to the field of electronic devices with a thermally conducting encapsulant for draining some of the energy dissipated by the electronic components contained in the electronic device. The thermally conducting encapsulant generally drains away the dissipated energy toward a cover that is also thermally conducting. The thermally conducting encapsulant also usually allows homogenization of the hot spots that are due to more localized energy dissipation in certain components.

According to a first prior art, the thermal encapsulant is a one-piece thermal block whose face on the component side is plane. However, when the size of the circuit of the electronic device increases, the number of components on the circuit also increases and the height of the various components becomes increasingly variable, that is to say becomes increasingly different from one component to another. The thermal efficiency, that is to say the efficiency of drainage from the electronic device of the energy dissipated in the electronic components, of such a one-piece thermal block with a plane face on a circuit the height of the components of which is relatively variable is low.

At the present time, electronic devices dissipating a great deal of energy generally operate with forced ventilation. However, it would be of interest to be able to reduce or eliminate this forced ventilation. This is because forced ventilation requires a fan in or outside the electronic device, consumes energy and makes the environment of the electronic device noisy. However, reducing or eliminating the forced ventilation decreases the thermal efficiency, by reducing the drainage of energy by convection. An electronic device with improved thermal efficiency would be of interest if it allowed the forced ventilation to be reduced or eliminated.

According to a second prior art, to improve the thermal efficiency, buried sinks may be added on the circuit of the electronic device. However, it is advantageous to be able to improve the thermal efficiency without redesigning the circuit contained in the electronic device, especially in the case of an already existing and optimized circuit.

According to a third prior art, the thermally conducting cover includes protuberances so as to match the variable height of the components on the circuit. Thermally conducting encapsulants are placed between the cover with protuberances and the components. Each electronic device requires a dedicated thermally conducting cover. To tailor a specific cover for each type of electronic device entails a high cost.

The invention provides an electronic device of high thermal efficiency in which good thermal conduction is ensured between the components, in which the energy is dissipated, and the thermally conducting cover, into which the dissipated energy is drained. Just by reducing the thickness of the air interfaces present in the dissipated energy drainage path, so as to maintain the thermal conduction above a given threshold required by the particular electronic device in question. The invention prevents excessive mechanical stresses being applied to the electronic components, which are generally fragile, and also being applied to other fragile elements such as, for example, the points where the connection leads of these components are soldered.

According to the invention, what is provided is an electronic device comprising: a circuit on which several electronic components able to dissipate energy are placed; a thermal conducting cover located opposite the circuit; a thermally conducting encapsulant placed between the circuit and the cover so as to ensure heat transfer, by conduction toward the cover, of the energy dissipated in the components; characterized in that the respective surfaces of the encapsulant and of the cover which are facing each other include a number of substantially complementary recesses and projections allowing the cover to fit into the encapsulant, and in that gaps are left between the recesses and the projections so as, on the one hand, to reduce the stress exerted by the cover on the encapsulant in the direction of the circuit and on the other hand, to maintain the thermal conduction between the encapsulant and the cover above a given conduction threshold.

The invention will be better understood and further features and advantages will become apparent from the description below and from the appended drawings, given by way of examples, in which.

Figure 3:
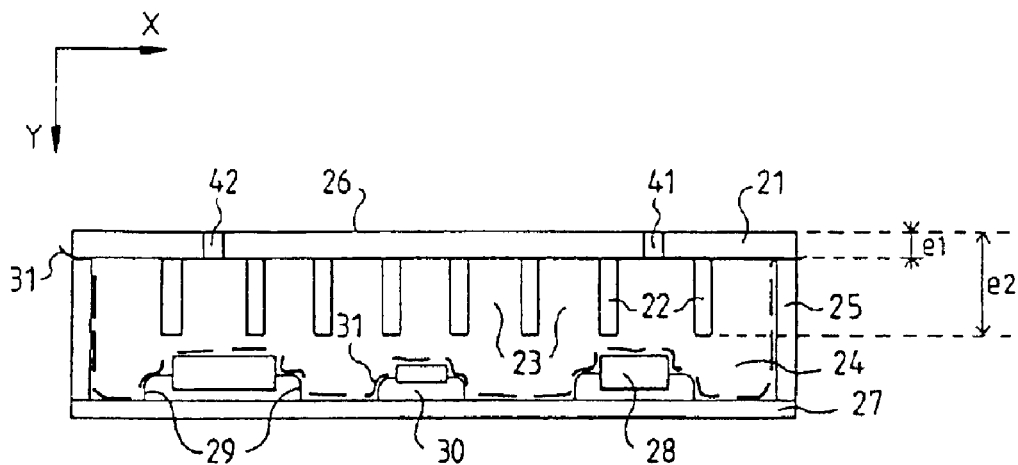
Figure 4:
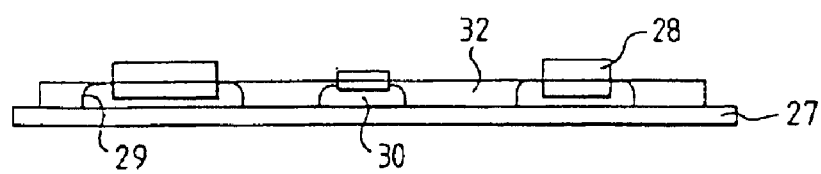

FIG. 3 shows schematically a first preferred embodiment of a device for at least partially covering the tooling circuit used in a preferred process for manufacturing a thermally conducting encapsulant of an electronic device according to the invention; and FIG. 4 shows schematically a second preferred embodiment of a device for at least partially covering the tooling circuit used in a preferred process for manufacturing a thermally conducting encapsulant of an electronic device according to the invention.

Figure 5:
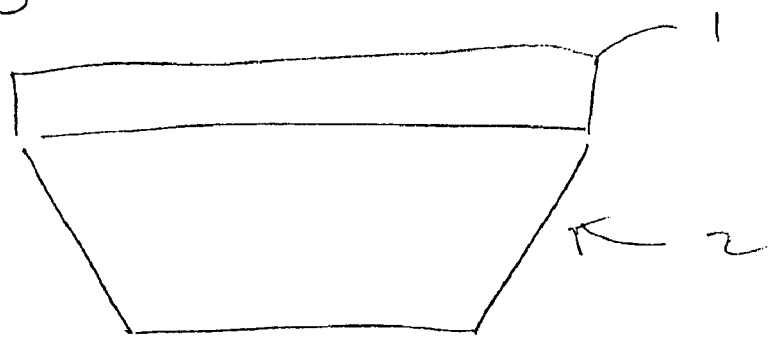

FIG. 5 shows an alternative embodiment of as section orthogonal to the mid-plane of the layers.

The electronic device comprises a circuit. Placed on this circuit are several electronic components. The electronic components dissipate, in operating mode, energy which must be drained away, at least partially, out of the electronic device. The components are relatively fragile elements on which the exerted stress is reduced thanks to the invention. The electronic device includes a cover. The cover is located opposite the circuit. The cover is thermally conducting, that is to say it is sufficiently conducting to allow a substantial portion of the energy dissipated in the components, and taken into the cover, to be drained away to the outside of the electronic device. To take the energy dissipated in the components into the thermally conducting cover, a thermally conducting encapsulant is placed between the circuit and the thermally conducting cover. Thus, a substantial portion of the energy dissipated in the components undergoes heat transfer by conduction to the cover. The encapsulant is sufficiently thermally conducting to allow the transfer of a substantial portion of the energy dissipated in the components to the cover. A substantial portion of the energy is a sufficiently large portion of the energy so that the thermal conduction between the components and the cover is maintained above a given conduction threshold, which is determined by the type of electronic device envisioned, that is to say by the type of application envisioned. The circuit, the encapsulant and the cover form a stack whose layers are placed substantially parallel to the mid-plane of the stack.

The cover has a surface facing the encapsulant and the encapsulant has a surface facing the cover. These respective surfaces of the encapsulant and of the cover which are facing each other include a number of substantially complementary projections and recesses so as to allow interlocking of the cover and the encapsulant, one in the other. The projections of the cover fit into the recesses of the encapsulant, while the projections of the encapsulant fit into the recesses of the cover. If the recesses and the projections were to be completely complementary, there would be complete interlocking of the cover and the encapsulant and there would be no gaps between the recesses and the projections, or the gaps that do exist would be negligible and of no appreciable effect. However, the size and the arrangement of the recesses and the projections are chosen so that the stress exerted by the cover on the encapsulant in the direction of the circuit is reduced. This stress is reduced compared with the case in which there would be complete interlocking. This stress is also reduced compared with the case of the prior art since, in the prior art, the facing surfaces of the cover and the encapsulant are plane and bear on each other, exerting and transmitting a stress on the components that is at least as high as, if not higher than, in the case of complete interlocking of the recesses and projections with no gap or when there are negligible gaps insufficient to substantially reduce the stress exerted on the components.

The electronic device according to the invention makes it possible to reduce or even eliminate the stress that is exerted on the components and can damage them or interfere with their operation. In the prior art, this stress is caused by the encapsulant, generally quite a hard material having a Shore A hardness of, for example, typically several tons, pressing down on the surface of the circuit comprising several or even many components whose height, that is to say the height above the level of the circuit, differs among the components or at least among some of them. During the mechanical handling of the electronic device, that is to say when it is being mounted, the stresses that might be exerted on the circuit by the cover via the encapsulant are reduced as they are at least partially absorbed by the gaps arranged between the recesses and the projections. These gaps are also arranged so that there is not an excessive decrease in the thermal conduction between the encapsulant and the cover, or even so that this is increased in certain preferred embodiments, and in any case so that the thermal conduction between the encapsulant and the cover is maintained above a given conduction threshold required by the type of electronic device envisioned, that is to say by the type of application envisioned. Those gaps between the respective surfaces of the cover and the encapsulant that are somewhat parallel to the mid-plane of the layers of the stack are large enough for the stress exerted by the cover on the encapsulant in the direction of the circuit to be reduced or even virtually eliminated. Those gaps between the respective surfaces of the cover and the encapsulant which are somewhat orthogonal to the mid-plane of the layers of the stack are small enough so that the thermal conduction between the encapsulant and the cover is maintained above the given conduction threshold required by the type of electronic device envisioned.

Figure 1:
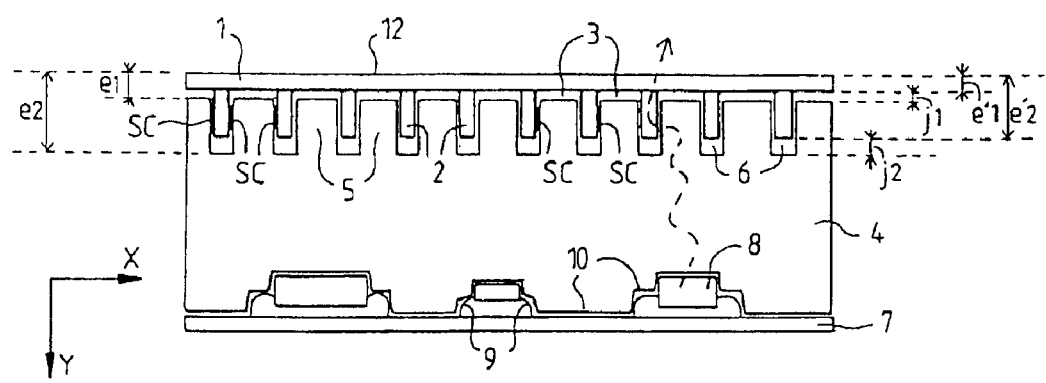
FIG. 1 shows schematically a preferred example of an electronic device according to the invention.

FIG. 1 shows schematically a preferred example of an electronic device according to the invention. The electronic device according to the invention is composed of a stack of several layers arranged so as to be parallel to the mid-plane of the stack. The mid-plane of the stack is parallel to the direction X and orthogonal to the direction Y and to the plane of FIG. 1. Included among the layers of the stack are the cover 1, the encapsulant 4 and the circuit 7. The thermally conducting cover 1 has projections 2 and recesses 3 that are preferably rectangular, that is to say have an outline that is preferably rectangular. The thermally conducting encapsulant 4 has projections 5 and recesses 6 that are preferably rectangular. The projections 2 and the recesses 3 of the cover 1, on the one hand, and the projections 5 and the recesses 6 of the encapsulant 4, on the other hand, are substantially complementary. The projections 2 of the cover 1 fit into the recesses 6 of the encapsulant 4, while the projections 5 of the encapsulant 4 fit into the recesses 3 of the cover 1. The projections 2 of the cover 1 are preferably all identical to one another. The recesses 3 of the cover 1 are preferably all identical to one another. Located on the circuit 7 are components 8 connected to the circuit 7 via connection leads 9. The lower surface 10 of the encapsulant 4, facing the circuit 7, has a shape that is matched to the heights of the components 8 on the circuit 7 so that, on the one hand, the stress exerted by the encapsulant 4 on the components 8 and, of course, on their connection leads 9 is low enough for there to be no risk of damaging the components 8 and their connection leads 9 and so that, on the other hand, the thermal conduction between the components 8 of the circuit 7 and the encapsulant 4 is high enough for there to be no risk of the components 8 heating up excessively. The dashed arrow represents one of the many possible paths for draining away the energy dissipated in one of the components 8 of the circuit 7 first through the thermally conducting encapsulant 4 toward the cover 1 and then subsequently toward the outside of the electronic device.

So as to reduce the stress exerted by the cover 1 on the encapsulant 4 in the direction of the circuit 7, and more particularly on the components 8 and their connection leads 9, gaps j1 and j2 are placed along the Y axis. A first gap j1 is placed between the recesses 3 of the cover 1 and the projections 5 of the encapsulant 4 and a second gap j2 is placed between the recesses 6 of the encapsulant 4 and the projections 2 of the cover 1. The cover 1 rests on one part of the electronic device, which is not shown in FIG. 1 for the sake of simplicity. In a preferred numerical example, the gaps j1 and j2 are each preferably around one millimeter. The depth of the projections 2 of the cover 1, that is to say the distance between the free end of the projections 2 of the cover 1 and the outer surface 12 of the cover 1, is e'2 whereas the thickness of the cover 1, that is to say the dimension of the cover 1 along the direction Y orthogonal to the mid-plane of the cover 1, is e'1. The tooling cover, shown in detail below in FIG. 3, more preferably has a thickness of e1= e' 1+j1 and the depth of these projections will advantageously be e2=e' 2+ j2.

So as to maintain the thermal conduction between the encapsulant 4 and the cover 1 above a given conduction threshold required by the type of electronic device envisioned, a contact surface SC of minimum area is provided between each projection 2 of the cover 1 on the one hand and each projection 5 of the encapsulant 4 on the other. The sum of the areas of all these contact surfaces SC is the overall contact surface SG between the cover 1 and the encapsulant 4. Preferably, the gaps between projections 2 of the cover 1 on the one hand and projections 5 of the encapsulant 4 on the other, along the X axis, are either zero, or small enough not to disrupt the thermal conduction, or even slightly negative in order to ensure that there is a good area of contact between the cover 1 and the encapsulant 4 so as to improve the thermal conduction.

The number of projections 2 of the cover 1 and projections 5 of the encapsulant 4, and of the recesses 3 of the cover 1 in the recesses 6 of the encapsulant 4, is not critical. This number is preferably high enough to ensure an overall contact surface SG with an area sufficient to ensure the desired thermal conduction between the encapsulant 4 and the cover 1. This number is preferably low enough to ensure, during manufacture of the encapsulant, preferably made of a moldable material that is curable or crosslinkable, a fluid flow of the material of the encapsulant by injection between the projections of a tooling cover, shown in detail below in FIG. 3, and easy demolding without any risk of damaging the encapsulant 4.

Since the cover 1, the encapsulant 4 and the circuit 7 constitute the layers of a stack, the contact surfaces between recesses and projections, facing the components 8, are preferably not parallel to the mid-plane of the layers, this non-parallelism being important above all in the case of the components 8 that are particularly fragile. The fewer said contact surfaces are parallel to the mid-plane of the layers the better, as the stress exerted by the cover 1 on the encapsulant 4 in the direction of the circuit 7, and consequently on the component 8, is less. For example in the case of FIG. 1 in which the projections and the recesses are rectangular, the contact surfaces SC, on the one hand for contact between the recesses 3 of the cover 1 and the projections 5 of the encapsulant 4, and, on the other hand, between the recesses 6 of the encapsulant 4 and the projections 2 of the cover 1 are not parallel to the mid-plane of the layers of the stack, which is the plane perpendicular to the Y axis. Consequently, the only contact surfaces SC between the cover 1 and the encapsulant 4 are contact surfaces SC between the projections 2 of the cover 1 and the projections 5 of the encapsulant 4. The contact surfaces between recesses and projections that are not facing components 8 or connection leads 9 are preferably not parallel to the mid-plane of the layers, but the stress exerted on the components 8 and on their connection leads 9 in the opposite case entails a lower risk of damaging the components 8 or their connections leads 9.

Preferably, the contact surfaces between recesses and projections, facing the components 8, are orthogonal to the mid-plane of the layers. The more said contact surfaces are orthogonal the better, as the stress exerted by the cover 1 on the encapsulant 4 in the direction of the circuit 7, and consequently on the components 8, is lower. For example in the case of FIG. 1, in which the projections and the recesses are rectangular, the contact surfaces SC are all parallel to the Y axis.

In a plane of section orthogonal to the mid-plane of the layers, the projections advantageously have a rectangular outline. This is the case, for example, in the electronic device shown in FIG. 1. In another embodiment, in a plane of section orthogonal to the mid-plane of the layers, the projections of the cover have a trapezoidal outline, the oblique sides of the trapezoid making between them an acute angle whose apex is directed toward the circuit 7 as shown in FIG. 5. This type of trapezoidal outline of the projections is also suitable but less effective than the rectangular outline, as a higher stress is then exerted in the direction of the circuit 7 on the components 8 and their connection leads 9.

The sum of all of the areas of the contact surfaces SC between recesses and projections amounts to an overall surface SG area preferably greater than or equal to the area of the mid-plane of the cover 1. For example, in FIG. 1, the area of the overall surface SG which is the sum of all the areas of the contact surfaces between the projections 2 of the cover 1 and the projections 5 of the encapsulant 4, is greater than the area of the interface that there would be between the cover 1 and the encapsulant 4 if the surfaces facing the cover 1 and the encapsulant 4 respectively were plane and had neither recesses nor projections. The area of the overall surface SG is then also greater than the area of the external surface 12 of the cover 1.

In one embodiment, the projections 2 of the cover 1 are preferably fins; it is then easier to mount the electronic device. In another embodiment, the projections 2 of the cover 1 may be studs.

Figure 2:
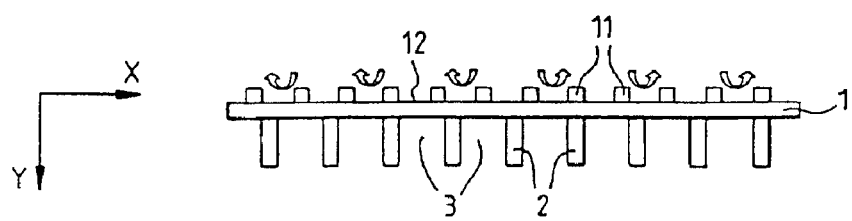
FIG. 2 shows schematically a preferred example of a thermally conducting cover of an electronic device according to the invention.

The cover 1 preferably also has projections on its external surface not facing the encapsulant 4. FIG. 2 shows schematically a preferred example of a thermally conducting cover 1 of an electronic device according to the invention. The thick arrows represent natural convection movements outside the electronic device. Projections 11 are placed on the external surface 12 of the cover 1. The projections 11 are preferably studs. The material of the cover 1 is thermally conducting and preferably aluminum.

The external surface 12 of the cover 1 preferably has dimensions of at least ten centimeters in each of the directions of its plane. The size of the external surface 12 of the cover 1 is generally similar to the size of the circuit 7. Advantageously, the electronic device is a digital electronic card having dimensions, for example, of around ten centimeters by around fifteen centimeters. An electronic card rack containing several digital electronic cards according to the invention may operate with less forced ventilation, or even without any forced ventilation.

The process for manufacturing a thermally conducting encapsulant 4 for an electronic device according to the invention preferably includes a step of injecting the encapsulant 4 into a mold which comprises a tooling cover having, on the side intended to be in contact with the encapsulant 4, projections substantially as wide as and deeper than the projections 2 of the cover 1, the depth of a projection being measured relative to a reference point chosen on the external surface of the tooling cover, so that the second gap j2 is correctly placed when mounting the electronic device. The tooling cover preferably has a greater thickness than the cover 1 so that the first gap j1 is correctly placed when mounting the electronic device. The thermally conducting encapsulant preferably has a high dielectric strength. The thermally conducting encapsulant is then preferably a moldable elastomer. The thermally conducting encapsulant is, for example, ELASTOSIL (registered trade mark) RT675 from Wacker or else TSE 3281 G1 (registered trade mark) from GE Silicones.

Preferably, the process for manufacturing the thermally conducting encapsulant uses a mold that includes, facing the tooling cover, a tooling circuit similar to the circuit, and a device for at least partially covering the tooling circuit, the covering device being located between the tooling cover and the tooling circuit and being placed so as substantially to match the shape of the tooling circuit and so as to prevent the encapsulant from being injected beneath the components or beneath the connection leads of the components of the tooling circuit. Thus, the demountable character of the electronic device, and more particularly of the encapsulant 4, is preserved, thus allowing maintenance and repair of the electronic device by permitting access to the electronic components 8 located on the circuit 7. Two devices for at least partially covering the tooling circuit will now be described with regard to FIGS. 3 and 4 respectively.

FIG. 3 shows schematically a first preferred embodiment of a device for at least partially covering the tooling circuit used in a preferred process for manufacturing a thermally conducting encapsulant of an electronic device according to the invention. The mold includes a tooling cover 21 having projections 22 and recesses 23. In the X direction, the projections 22 of the tooling cover 21 are advantageously of the same size as the projections 2 of the cover 1. In the Y direction, the projections 22 of the tooling cover 21 have a greater depth than the depth of the projections 2 of the cover 1 in order to create the second gap j2, when mounting the electronic device according to the invention. The depth is measured from the external surface 26 of the tooling cover 21 as far as the free end of the projections 22 for the tooling cover 21—it is equal to e2 in FIG. 3. The depth is measured from the external surface 12 of the cover 1 as far as the free end of the projections 2 for the cover 1—it is equal to e'2 in FIG. 1. In order for the first gap j1 to be correctly positioned when mounting the electronic device, the thickness of the tooling cover 21, that is to say its dimension along the Y axis orthogonal to its mid-plane, which is equal to e1 in FIG. 3, is greater than the thickness of the cover 1 which is equal to e'1 in FIG. 1. A correctly profiled tooling circuit 27 or a tooling circuit 27 with components 28 and connection leads 29 has, between the tooling circuit 27 and the component 28, a space 30 that is a precluded region for demountability. Between the tooling cover 21 and the tooling circuit 27 there is a space 24 which is the region into which the encapsulant 4 is injected. A frame 25 closes the mold. The purpose of the device 31 for at least partially covering the circuit 27 is to prevent encapsulant 4 from being injected into the precluded region 30 for demountability. If some encapsulant 4 were to be injected into the precluded region 30 for demountability, the encapsulant 4 could not be demounted and consequently the components 28 could no longer be repaired from the tooling circuit 27. The covering device 31 preferably covers the entire tooling circuit 27. The covering device 31 is preferably a weakly adhering film. The film 31 is, for example, made of a polyethylene or a polypropylene or a styrenic. In FIG. 3, the film 31 was shown as long bold dashed lines.

Encapsulant 4 may be injected into the injection region 24 by means of, for example, a hole 41 and a vent 42 in the tooling cover 21. After injection, the tooling cover 21 is withdrawn and, thanks to the weakly adhering film 31, the thermally conducting encapsulant 4 can be easily extracted in order thereafter to be mounted in the electronic device.

The injection of encapsulant 4 may also be accomplished, for example, by the encapsulant 4 flowing directly into the injection region 24 under gravity in a direction perpendicular to the plane of FIG. 3.

FIG. 4 shows schematically a second preferred embodiment of a device for at least partially covering the tooling circuit used in a preferred process for manufacturing a thermally conducting encapsulant of an electronic device according to the invention. The covering device is a heel 32 embedding the connection leads 29 and filling the space between components 28 and tooling circuit 27, namely the precluded region 30 for demountability. The material of the heel 32 is advantageously an epoxy.

What is claimed is:

1. An electronic device comprising: a circuit on which several electronic components able to dissipate energy are placed; a thermal conducting cover located opposite the circuit; a thermally conducting encapsulant placed between the circuit and the cover so as to ensure heat transfer, by conduction toward the cover, of the energy dissipated in the components; wherein the respective surfaces of the encapsulant and of the cover which are facing each other include a number of substantially complementary recesses and projections allowing the cover to fit into the encapsulant; and that gaps are left between the recesses and the projections so as, on the one hand, to reduce the stress exerted by the cover on the encapsulant in the direction of the circuit and on the other hand, to maintain the thermal conduction between the encapsulant and the cover above a given conduction threshold, wherein since the cover, the encapsulant and the circuit constitute the layers of a stack, the contact surfaces between recesses and projections, facing the components, are not parallel to the mid-plane of the layers, wherein in a plane of section orthogonal to the mid-plane of the layers, the projections of the cover have a trapezoidal outline, the oblique sides of the trapezoid making between them an acute angle whose apex is directed toward the circuit.

2. The electronic device as claimed in claim 1, wherein the contact surfaces between recesses and projections, facing the components are orthogonal to the mid-plane of the layers.

3. The electronic device is claimed in claim 2, wherein in a plane of section orthogonal to the mid-plane of the layers, the projections have a rectangular outline.

4. The electronic device as claimed in claim 1, wherein the sum of the areas of all of the contact surfaces between recesses and projections amounts to an overall surface having an area substantially greater than the area of the mid-plane of the cover.

5. The electronic device as claimed in claim 1, wherein the projections of the cover are fins.

6. The electronic device as claimed in claim 1, wherein the projections of the cover are studs.

7. The electronic device as claimed in claim 1, wherein the gaps between recesses and projections are of the order of one millimeter.

8. The electronic device as claimed in claim 1, wherein the cover also includes projections on its external surface, which surface is not facing the encapsulant.

9. The electronic device as claimed in claim 1, wherein the dimensions of the external surface of the cover are at least ten centimeters in each direction.

10. The electronic device as claimed in claim 1, wherein the cover is made of aluminum.

11. The electronic device as claimed in claim 1, wherein the electronic device is a digital electronic card.

12. An electronic card rack, comprising several digital electronic cards as claimed in claim 11 and in that it is not subjected to forced ventilation.

13. A process for manufacturing a thermally conducting encapsulant for an electronic device as claimed in claim 1, wherein the thermally conducting encapsulant having recesses and projections on its surface intended to face the cover, wherein the process includes a step of injecting the encapsulant into a mold which comprises a tooling cover having, on the side intended to be in contact with the encapsulant, projections substantially as wide as and deeper than the projections of the cover, the depth of a projection being the distance from the free end of the projection to the external surface of the cover or of the tooling cover.

14. The process for manufacturing a thermally conducting encapsulant as claimed in claim 13, wherein the thickness, that is to say the dimension along the direction (Y) orthogonal to its mid-plane, of the tooling cover is greater than the thickness of the cover.

15. The process for manufacturing a thermally conducting encapsulant as claimed in claim 13, wherein the mold comprises, facing the tooling cover, a tooling circuit similar to the circuit, and a device for at least partially covering the tooling circuit, the covering device being located between the tooling cover and the tooling circuit and being placed so as substantially to match the shape of the tooling circuit and so as to prevent encapsulant from being injected beneath the components or beneath the connection leads of the components of the tooling circuit.

16. The process for manufacturing a thermally conducting encapsulant as claimed in claim 15, wherein the covering device is a heel embedding the connection leads and filling the space between components and tooling circuit.

17. The process for manufacturing a thermally conducting encapsulant as claimed in claim 16, wherein the material of the heel is an epoxy.

18. The process for manufacturing a thermally conducting encapsulant as claimed in claim 15, wherein the covering device is a weakly adhering film.

19. The process for manufacturing a thermally conducting encapsulant as claimed in claim 18, wherein the film is made of a polyethylene or a polypropylene or a styrenic.

20. The process for manufacturing a thermally conducting encapsulant for an electronic device as claimed in claim 13, wherein the thermally conducting encapsulant is a moldable elastomer.

* * * * *